United States Patent
Lee (10) Patent No.: US 8,386,903 B2
(45) Date of Patent: Feb. 26, 2013

(54) BIT REVERSE INTERLEAVING METHODS FOR QAM MODULATION IN A WIRELESS COMMUNICATION SYSTEM

(75) Inventor: Jung Woon Lee, Allen, TX (US)

(73) Assignee: FutureWei Technologies, Inc., Plano, TX (US)

( * ) Notice: Subject to any disclaimer, the term of this patent is extended or adjusted under 35 U.S.C. 154(b) by 1003 days.

(21) Appl. No.: 12/260,677

(22) Filed: Oct. 29, 2008

(65) Prior Publication Data

US 2009/0113274 A1    Apr. 30, 2009

Related U.S. Application Data

(60) Provisional application No. 60/983,982, filed on Oct. 31, 2007.

(51) Int. Cl.
*G06F 11/00* (2006.01)
(52) U.S. Cl. ....................................................... 714/801
(58) Field of Classification Search .................. 714/755, 714/761, 762, 790, 801
See application file for complete search history.

(56) References Cited

U.S. PATENT DOCUMENTS

| | | | |
|---|---|---|---|
| 6,668,350 B1 | 12/2003 | Kim | |
| 6,961,388 B2 * | 11/2005 | Ling et al. | 375/267 |
| 7,003,703 B2 * | 2/2006 | Chun | 714/701 |
| 7,142,610 B1 * | 11/2006 | Wang | 375/262 |
| 7,170,849 B1 | 1/2007 | Arivoli et al. | |
| 7,802,171 B2 * | 9/2010 | Li et al. | 714/790 |
| 7,876,670 B2 * | 1/2011 | Li et al. | 370/206 |
| 7,945,001 B2 * | 5/2011 | Ha et al. | 375/341 |
| 2002/0126763 A1 | 9/2002 | Jeong et al. | |
| 2002/0146074 A1 * | 10/2002 | Ariel et al. | 375/240.27 |
| 2002/0159423 A1 * | 10/2002 | Yao et al. | 370/342 |
| 2003/0079170 A1 * | 4/2003 | Stewart et al. | 714/755 |
| 2003/0156659 A1 * | 8/2003 | Hanaoka et al. | 375/298 |
| 2004/0221219 A1 * | 11/2004 | Von Elbwart et al. | 714/748 |
| 2005/0071729 A1 | 3/2005 | Kim | |
| 2005/0108610 A1 * | 5/2005 | Kim et al. | 714/748 |
| 2005/0122896 A1 | 6/2005 | Song et al. | |
| 2005/0135493 A1 * | 6/2005 | Maltsev et al. | 375/260 |
| 2006/0036924 A1 * | 2/2006 | Ghosh | 714/755 |
| 2006/0107171 A1 * | 5/2006 | Skraparlis | 714/752 |
| 2006/0114910 A1 | 6/2006 | Sindhushayana et al. | |

FOREIGN PATENT DOCUMENTS

CN    1287718 A    3/2001

OTHER PUBLICATIONS

IEEE Standards 802.16™-2004, IEEE Standard for Local and metropolitan area networks, "Part 16: Air Interface for Fixed Broadband Wireless Access Systems," 2004, chapter 8.4.9.2, pp. 589-620.
Written Opinion of the International Searching Authority received in Patent Cooperation Treaty Application No. PCT/CN/2008/072900 mailed Feb. 5, 2009, 7 pages.
International Search Report of the International Searching Authority received in Patent Cooperation Treaty Application No. PCT/CN/2008/072900 mailed Feb. 5, 2009, 4 pages.

* cited by examiner

*Primary Examiner* — Scott Baderman
*Assistant Examiner* — Elmira Mehrmanesh
(74) *Attorney, Agent, or Firm* — Slater & Matsil, L.L.P.

(57) ABSTRACT

In a communication method, a sequence of information bits is encoded into systematic bits and parity bits. The systematic bits and the parity bits are grouped in output blocks, each output block to be assigned to an address of a constellation scheme. The addresses include addresses that are more prone to error and address that are less prone to error so that the symbols are grouped such that bits in groups of consecutive bits of the sequence of information bits are not all assigned to addresses that are more prone to error.

26 Claims, 5 Drawing Sheets

BIT REVERSE INTERLEAVING METHODS FOR QAM MODULATION IN A WIRELESS COMMUNICATION SYSTEM

This application claims the priority benefit of U.S. Provisional Application No. 60/983,982 filed Oct. 31, 2007, entitled "Improved Bit Reverse Interleaving Methods for Optimizing QAM Modulation in a Wireless Communication System," by Jung Woon Lee, which application is incorporated herein by reference.

TECHNICAL FIELD

The present invention generally relates to communication systems. In particular embodiments, the present invention relates to a novel method of interleaving/deinterleaving and optimizing the constellation bit mapping for quadrature amplitude modulation (QAM) in wireless communication systems.

BACKGROUND

The increasing demand of wireless high data service has motivated various standards bodies such as 3GPP2 ($3^{rd}$ generation partnership project 2), 3GPP ($3^{rd}$ generation partnership project) and IEEE-802.16 to develop various wireless systems supporting faster data rate, higher spectral efficiency and more reliable communication such as an ultra mobile broadband (UMB), a long term evolution (LTE) and wireless metropolitan area networks (MAN), respectively. 16 and 64 QAM have been widely adopted by those standard bodies to achieve faster data rate and higher spectral efficiency. In those standards, turbo coding is a key technology of forward error correction in high data packet service.

It is well known that turbo or convolutional codes are superior at correcting random error, than burst errors. Interleaving is carried out to improve the turbo decoder performance in a wireless environment channel where the signal may experience deep fading thereby causing the burst error in a codeword. To overcome such burst errors, interleaving is applied between the channel encoder and the modulation symbol mapper in wireless digital communication system.

Figure 1:
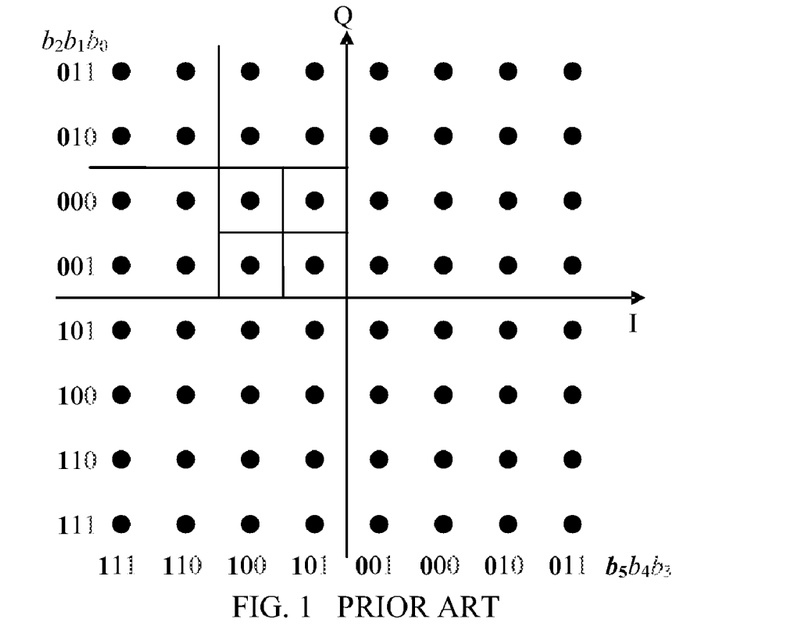
FIG. 1 illustrates a 64-QAM constellation used in one example of the present invention.

In a system employing higher order QAM such as 16 or 64 QAM, careful attention should be paid when designing interleaving because each constellation bit in a QAM constellation is unequally protected. For example, there are three protection classes in 64 QAM as shown in FIG. 1. FIG. 1 shows 64QAM signal constellation employed in IEEE 802.16 Wireless MAN. In FIG. 1, 6 bits ($b_0, b_1, b_2, b_3, b_4, b_5$) are grouped to form a modulation symbol, which is a complex-valued signal. Bits $b_2$ and $b_5$ belong to the best protected class. Bits $b_1$ and $b_4$ belong to the $2^{nd}$ protection class while bits $b_0$ and $b_3$ belong to the $3^{rd}$ class which has the worst protection.

A bit reversal interleaver (BRI) type of channel interleaver is employed in both wireless MAN and UMB systems. An m-bit reversal interleaver operates on a sequence of length $N=2^m$ by mapping each index to its bit reversed value. Since the bit position of a permuted sequence by bit reversal interleaver is distributed well randomly, it provides for robustness against burst errors. Since the size of data to be interleaved may not be the power of 2, modified bit reversal interleavers or pruned bit reversal interleaver are widely employed.

Figure 2:
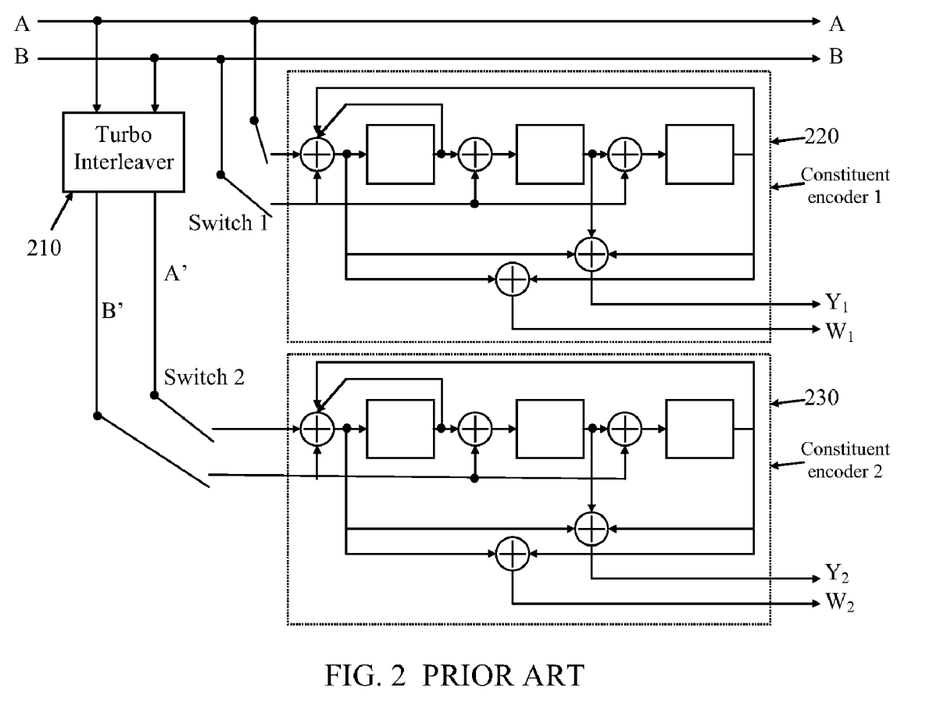
FIG. 2 illustrates a convolutional turbo encoder.

FIG. 2 illustrates the turbo encoder employed in IEEE802.16 wireless MAN. A double binary circular recursive systematic convolutional code is used as its constituent encoder. The bits of the data to be encoded are alternately fed to A and B. First, Switch 1 is on and the input sequence is fed into the constituent encoder 1 220. First Constituent encoder 1 generates sequences Y1 and W1, which are parity bits of sequence A and B. After completing encoding of sequences A and B, Switch 1 is off while Switch 2 is on.

Next, Sequences A and B are interleaved by the turbo interleaver 210 and their permuted sequences A' and B' are fed into the constituent encoder 2 230 and their parity sequences Y2 and W2 are generated. After turbo encoder, 6 blocks (A, B, $Y_1, W_1, Y_2, W_2$) are generated and its output order will be A, B, $Y_1, Y_2, W_1$ and $W_2$ and size of each block is half of encoded packet size.

Figure 3:
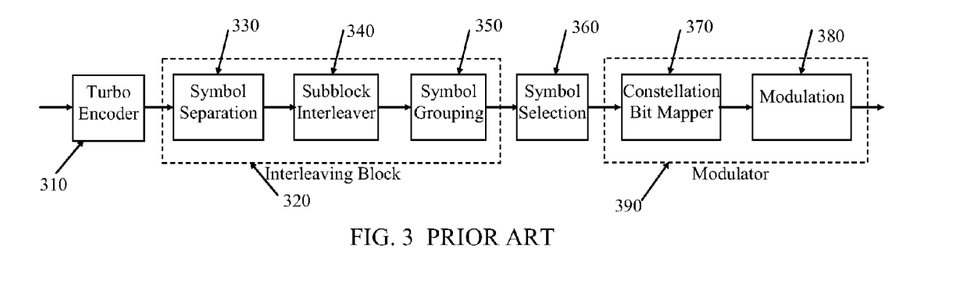
FIG. 3 illustrates the channel coding process of prior art.

FIG. 3 shows the channel coding process of a wireless MAN embedding turbo code. First, the input packet is encoded by ⅓ turbo encoder 310 and the double binary convolutional turbo code (CTC) is used. A current system punctures the mother codeword to generate a subpacket with various coding rates. The subpacket is also used as hybrid automatic repeat request (HARQ) packet transmission. The ⅓ CTC encoded codeword goes through the interleaving block 320 and the puncturing is performed in symbol selection block 360.

The interleaving block 320 includes symbol separation block 330, sub-block interleaver 340, and symbol grouping block 350. The detail operation of interleaving block 320 is shown in FIG. 4.

In symbol selection block 360, the puncturing is performed to select the consecutive interleaved bit sequence that starts at any point of whole codeword. For the first transmission, the subpacket is generated to select the consecutive interleaved bit sequence that start from the first bit of the systematic part of the mother codeword. The length of the subpacket is chosen according to the needed coding rate reflecting the channel condition. The first subpacket can also be used as a codeword with the needed coding rate for a burst where HARQ is not applied. The symbols in a subpacket generated by the symbol selection block 360 are formed by selecting specific sequence of symbols from the interleaved CTC encoder output sequence.

The resulting subpacket sequence is a binary sequence of symbol for the modulator 390. The modulator 390 includes constellation bit-mapper 370 and modulation block 380. In constellation bit-mapper 370, each M interleaved bit is mapped to the constellation bits $b_{M-1} \sim b_0$ (the first bit is mapped to the higher index bit in the constellation). The constellation mapped data shall be subsequently modulated in modulation block 380.

Figure 4:
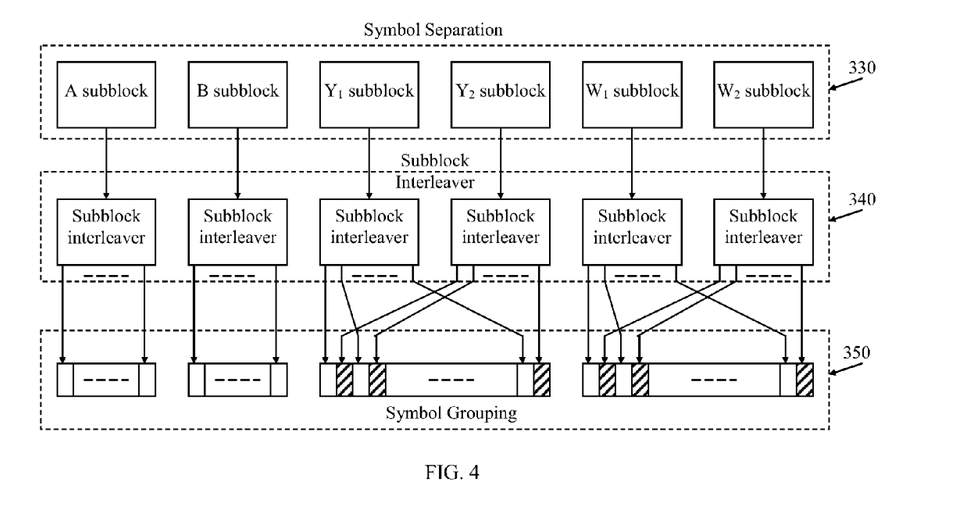
FIG. 4 illustrates the detail of channel interleaving scheme of the prior art.

FIG. 4 shows the detailed operation of interleaving block 320 in FIG. 3, which consist of symbol separation block 330, Sub-block interleaver 340 and symbol grouping block 350. In symbol separation block 330, all encoded symbols are demultiplexed into six sub-blocks denoted A, B, $Y_1, Y_2, W_1$ and $W_2$. The encoder output symbols are sequentially distributed into six sub-blocks with the first N encoder output symbols going to the A sub-block, the second N encoder output going to the B sub-block, the third N to the $Y_1$ sub-block, the fourth N to the $Y_2$ sub-block, the fifth N to the $W_1$ sub-block, the sixth the $W_2$ sub-block, etc. Then six sub-blocks are interleaved separately in sub-block interleaver 340.

In IEEE802.16 wireless MAN, the modified bit reversal interleaver is used as sub-block interleaver. In the modified bit reversal interleaver, the entire sub-block of symbols to be interleaved is stored into an array at addresses from 0 to the number of the symbols minus one (N−1) and the interleaved symbols are read out in permuted order and read address is basically determined by $2^m (k \bmod J) + BRO_m(k/J)$ according to interleaver parameters m and J, which are predetermined value according to block size N as long as the generated address is smaller than N, where $BRO_m(y)$ indicates the bit reversed m bit value of y. In the pruned bit reversal interleaver, the read address is determined by solely $BRO_m(k)$ and the larger address than the block size N is removed, where $N=2^m$.

In symbol grouping block 350, the sub-block-interleaved versions of A and B blocks are by-passed while the interleaved $Y_1$ and $Y_2$ sub-block sequence are multiplexed and the interleaved $W_1$ and $W_2$ are multiplexed. The output order of symbol grouping block 351 is the interleaved A and B sub-block sequence followed by a symbol-by-symbol multiplexed sequence of interleaved $Y_1$ and $Y_2$ sub-block sequence, followed by a symbol-by-symbol multiplexed sequence of the interleaved $W_1$ and $W_2$ sub-block sequence. The symbol-by-symbol multiplexed sequence of interleaved $Y_1$ and $Y_2$ sub-block sequences shall consist of the first output bit from the $Y_1$ sub-block interleaver the first output bit from the $Y_2$ sub-block interleaver, the second output bit from the $Y_1$ sub-block interleaver, the second output bit from the $Y_2$ sub-block interleaver, etc. The symbol-by-symbol multiplexed sequence of the interleaved $W_1$ and $W_2$ sub-block sequences shall consist of the first output bit from the $W_1$ sub-block interleaver, the first output bit from the $W_2$ sub-block interleaver, the second output bit from the $W_1$ sub-block interleaver, the second output bit from the $W_2$ sub-block interleaver, etc.

This design of interleaving has the following inharmonious operation when it is operated with 64-QAM modulation. As stated earlier, there are three protection classes in 64 QAM constellation bits as shown in FIG. 1, best-class ($b_2$, $b_5$), good-class ($b_1$, $b_4$) and worst-class ($b_0$, $b_3$). According to the operation of existing interleaving scheme, in each sub-block (A, B, $Y_1$, $Y_2$, $W_1$ or $W_2$), the symbols in some groups comprising n bits consecutive sequence of N bits are mapped into best class while the symbols belonging to other groups are mapped into the good or worst class. The number of group and its size n are determined by the input packet size. One example for input packet size 384 is shown Table 1. When the input packet size of encoder is 384, the sub-block size N is 192 and input address for each bits spans 0 to 191.

Table 1 shows the address corresponding to input bits in sub-block A or B mapped to each 64-QAM constellation bit ($b_0$, $b_1$, $b_2$, $b_3$, $b_4$, $b_5$). $0^{th}$ to $63^{rd}$ input bits are mapped into best class ($b_2$, $b_5$), $64^{th}$ to $127^{th}$ input bits are mapped into good class ($b_1$, $b_4$) and $128^{th}$ to $191^{th}$ input bits are mapped into worst class ($b_0$, $b_3$). If the pruned bit reversal interleaver is used instead of the modified bit reversal interleaver, it has still same problem as above. At this given circumstance, it's more likely that some codeword bits are mapped into worst- or good-class in 64-QAM constellation will cause more errors than ones mapped into best-class because effective signal to noise ratio (SNR) of those bits mapped into worse class is lower than bits mapped into better class. In this case, it is more likely that the burst error among those bits mapped into worst class will happen because those consecutive codeword bits experience equivalently low SNR together and the decoder of turbo code undergoes severe performance degradation.

TABLE 1

| Modulation Symbol | Address of input bits mapped to constellation bit | | | | | |
|---|---|---|---|---|---|---|
| Index | b5 | b4 | b3 | b2 | b1 | b0 |
| 0 | 0 | 64 | 128 | 32 | 96 | 160 |
| 1 | 16 | 80 | 144 | 48 | 112 | 176 |
| 2 | 8 | 72 | 136 | 40 | 104 | 168 |
| 3 | 24 | 88 | 152 | 56 | 120 | 184 |
| 4 | 4 | 68 | 132 | 36 | 100 | 164 |
| 5 | 20 | 84 | 148 | 52 | 116 | 180 |
| 6 | 12 | 76 | 140 | 44 | 108 | 172 |
| 7 | 28 | 92 | 156 | 60 | 124 | 188 |
| 8 | 2 | 66 | 130 | 34 | 98 | 162 |
| 9 | 18 | 82 | 146 | 50 | 114 | 178 |
| 10 | 10 | 74 | 138 | 42 | 106 | 170 |
| 11 | 26 | 90 | 154 | 58 | 122 | 186 |
| 12 | 6 | 70 | 134 | 38 | 102 | 166 |
| 13 | 22 | 86 | 150 | 54 | 118 | 182 |
| 14 | 14 | 78 | 142 | 46 | 110 | 174 |
| 15 | 30 | 94 | 158 | 62 | 126 | 190 |
| 16 | 1 | 65 | 129 | 33 | 97 | 161 |
| 17 | 17 | 81 | 145 | 49 | 113 | 177 |
| 18 | 9 | 73 | 137 | 41 | 105 | 169 |
| 19 | 25 | 89 | 153 | 57 | 121 | 185 |
| 20 | 5 | 69 | 133 | 37 | 101 | 165 |
| 21 | 21 | 85 | 149 | 53 | 117 | 181 |
| 22 | 13 | 77 | 141 | 45 | 109 | 173 |
| 23 | 29 | 93 | 157 | 61 | 125 | 189 |
| 24 | 3 | 67 | 131 | 35 | 99 | 163 |
| 25 | 19 | 83 | 147 | 51 | 115 | 179 |
| 26 | 11 | 75 | 139 | 43 | 107 | 171 |
| 27 | 27 | 91 | 155 | 59 | 123 | 187 |
| 28 | 7 | 71 | 135 | 39 | 103 | 167 |
| 29 | 23 | 87 | 151 | 55 | 119 | 183 |
| 30 | 15 | 79 | 143 | 47 | 111 | 175 |
| 31 | 31 | 95 | 159 | 63 | 127 | 191 |

SUMMARY OF THE INVENTION

In one aspect, the present invention solves the inharmonious operation of bit reversal interleaving type of channel interleaver with M-ary QAM in communication system.

As a first example, embodiments of the present invention provide a method and apparatus for efficiently mapping the turbo encoded data into M-ary QAM where the interleaver contains a BRO (Bit reverse operation) function.

As another example, embodiments of the present invention provide an interleaving method and apparatus for efficiently operating with M-ary QAM.

As yet another example, embodiments of the present invention provide a method and apparatus for improving a turbo decoder operated with interleaver containing BRO function as an efficient mapping of turbo encoded data into an M-ary QAM constellation.

In one implementation, additional devices are combined with a channel encoding process containing BRO-typed interleaver, where a BRO-typed interleaver is the channel interleaver containing a BRO operation when calculating the permuted address. Newly added devices are followed by a BRO-typed interleaver and named as write-to R×C matrix and intra-row permutation block. In write-to R×C matrix, the serial input is written into a 2-dimensional matrix and then elements of each row are permuted in Intra-row permutation block.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The present disclosure can be described by the embodiments given below. It is understood, however, that the embodiments below are not necessarily limitations to the present disclosure, but are used to describe a typical implementation of the invention.

Embodiments of present invention provide a unique method and apparatus for channel coding process in a wireless communication system. It is understood, however, that the following disclosure provides many different embodiments, or examples, for implementing different features of the invention. Specific examples of components, signals and arrangements are described below to simplify the present disclosure. These are, of course, merely examples and are not intended to limit the invention from that described in the claims. Well known elements are presented without detailed description in order not to obscure the present invention in unnecessary detail. For the most part, details that are not necessary to obtain a complete understanding of the present invention have been omitted inasmuch as such details are within the skills of persons of ordinary skill in the relevant art. Details regarding control circuitry described herein are omitted since control circuits are within the skills of persons of ordinary skill in the relevant art.

Figure 5:
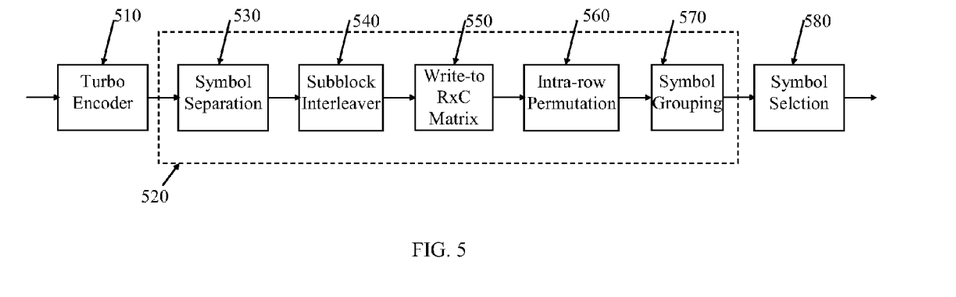
FIG. 5 illustrates the channel coding process of the present invention.

FIG. 5 shows the channel coding process of the present invention. First, the input packet is encoded by turbo encoder 510. Then, the turbo encoded codeword goes through the interleaving block 520 and puncturing is performed in Symbol selection block 580. The interleaving block of the present invention 520 includes Symbol Separation block 530, Sub-block interleaver 540, write-to R×C matrix block 550, intra-row permutation block 560 and symbol grouping block 570.

The operation of symbol separation block 530, sub-block interleaver 540 and symbol grouping block 570 has already been described with respect to FIG. 3. As a result, this description will not be repeated here.

In embodiments of the present invention, the interleaved symbols from sub-block interleaver 540 are written into R×C matrix (memory), whose row size is R and column size is C, in write-to R×C matrix 550 after sub-block interleaver 540. First C interleaved symbols are written into first row, second C interleaved symbols are written into second row, and so on. Then, in intra-row permutation 560, the symbols in each row are permuted by predetermined patterns or a specific permutation formula in accordance row-index. For example, the permutation can be a cyclic shift of bit position or patterns stored in memory.

Finally, the entire array of symbols are read out row-wise, starting from top-row and read from left-most element of each row, and the output of the intra-row permutation block 560 is fed into the symbol grouping block 580 whose operation is same as the symbol grouping block 350 as described with respect to FIG. 3. Then, the channel interleaved symbols by the channel interleaving block 520 are modulated in same way of the prior art.

Figure 6:
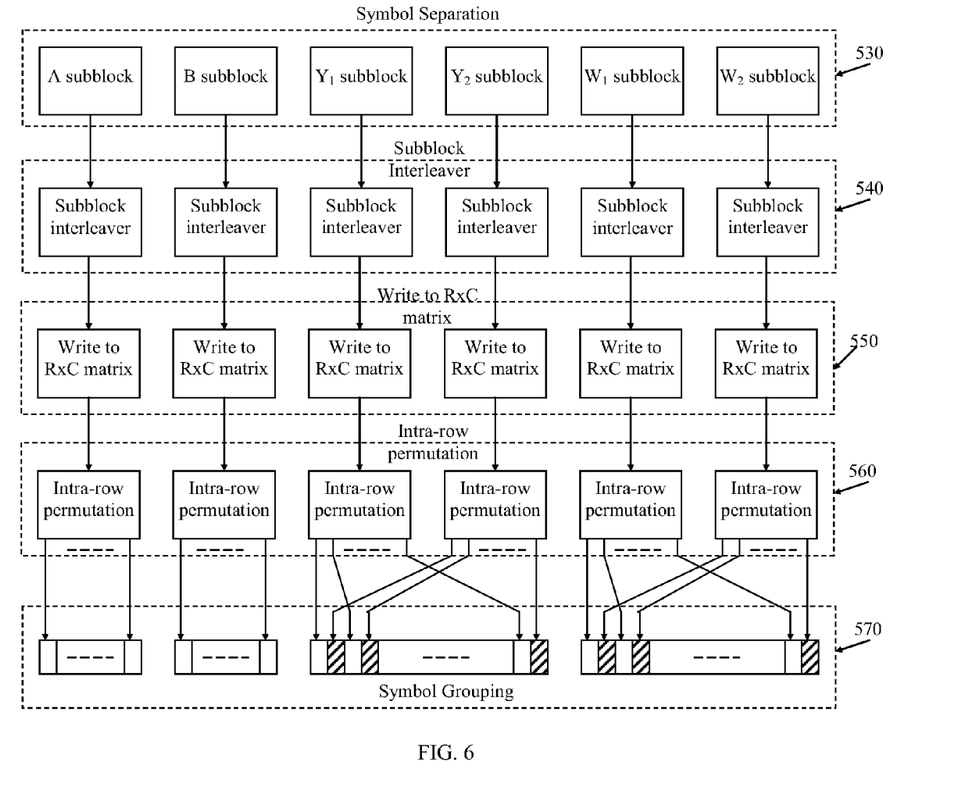
FIG. 6 illustrates the detail of channel interleaving scheme of the present invention.

The detailed operation of interleaving block 520 is shown in FIG. 6. In symbol separation block 530, all encoded symbols are demultiplexed into six sub-blocks denoted A, B, $Y_1$, $Y_2$, $W_1$ and $W_2$. The operation of this block, is exactly the same as the symbol separation block 330 of the prior art as described with respect to FIG. 4. Then, six sub-blocks are interleaved separately in sub-block interleaver 540, which is the bit reversal interleaving type of channel interleaver such as the modified bit reversal interleaver or the pruned bit reversal interleaver. In IEEE802.16 wireless MAN, the modified bit reversal interleaver is used as sub-block interleaver.

In write-to R×C matrix 550, N interleaved symbols of each block are written into an R×C matrix-shaped memory comprising $R(=\lfloor N/C \rfloor)$ rows with size C, in row-wise, meaning that the first C interleaved symbols are written into first row from left-most, the second C interleaved symbols are written into second row, and so on. The function $\lfloor x \rfloor$ indicates a floor function that returns the highest integer less than or equal to x. If N is not equal to R×C, only R×C elements of input are processed and the rest of the inputs are by-passed through the write-to R×C matrix 550 and the intra-row permutation block 560.

An example of a write-to R×C matrix is shown in Table 2, where the input is {0,1,2, ..., 30,31} and N is 32, where C is 6 and R is equal to $\lfloor N/C \rfloor$=5. Only R×C elements of input are written into memory 550 and are permuted in the Intra-row permutation block 560 while N−R×C elements of input are just by-passed through these two blocks.

In intra-row permutation block 560, the elements of each row are reordered in a predetermined pattern or a specific permutation formula in accordance with a row-index. Then, the entire array of symbols is read out row-wise, starting from top-row and read from left-most element of each row, and is fed into the symbol grouping block 570. The permutation pattern is presented in Table 3 and the input of intra-row permutation block 560 is shown in Table 2, The result of intra-row permutation is then shown in Table 4 when the permutation pattern of row i is taken as P[i mod 3] in Table 3, where mod indicate the modulo operation. That result can also be obtained as the followings equation: $A_i(k)=(k+i \bmod 3) \bmod C$, where $A_i(k)$ is the location index of k-th element of i-th row at given C elements of i-th row. Then, output of intra-row permutation block 604 become {0,1,2,3, 4,5,7,8,9,10,11,6,14,15, ..., 25,26,27,28,29,24,30,31}.

TABLE 2

| Row | Column | | | | | |
|-----|---|---|---|---|---|---|
|  | 0 | 1 | 2 | 3 | 4 | 5 |
| 0 | 0 | 1 | 2 | 3 | 4 | 5 |
| 1 | 6 | 7 | 8 | 9 | 10 | 11 |
| 2 | 12 | 13 | 14 | 15 | 16 | 17 |
| 3 | 18 | 19 | 29 | 21 | 22 | 23 |
| 4 | 24 | 25 | 26 | 27 | 28 | 29 |

TABLE 3

| | Permutation Pattern |
|---|---|
| P[0] | {0, 1, 2, 3, 4, 5} |
| P[1] | {1, 2, 3, 4, 5, 0} |
| P[2] | {2, 3, 4, 5, 0, 1} |

TABLE 4

| Row | Column | | | | | |
|---|---|---|---|---|---|---|
| | 0 | 1 | 2 | 3 | 4 | 5 |
| 0 | 0 | 1 | 2 | 3 | 4 | 5 |
| 1 | 7 | 8 | 9 | 10 | 11 | 6 |
| 2 | 14 | 15 | 16 | 17 | 12 | 13 |
| 3 | 18 | 19 | 29 | 21 | 22 | 23 |
| 4 | 25 | 26 | 27 | 28 | 29 | 24 |

R and C of write-to R×C block 550 of each sub-block can be set differently for randomization of each sub-block. The operation of write-to R×C block 550, as well as, the permutation pattern of intra-row permutation block 560 can be different from different sub-blocks as well. For example, the permutation formula for each block (A, B, Y1, Y2, W1 or W2) can be set as followings:

$$A_i(j) = (j + \lfloor 5 \cdot i/R \rfloor) \bmod C \quad (1)$$

$$B_i(j) = (j + \lfloor 5 \cdot (i+R)/R \rfloor) \bmod C \quad (2)$$

$$Y_{1,i}(j) = (j + \lfloor 5 \cdot i/R \rfloor) \bmod C \quad (3)$$

$$W_{1,i}(j) = (j + \lfloor 5 \cdot (i+R)/R \rfloor) \bmod C \quad (4)$$

$$Y_{2,i}(j) = (j + \lfloor 5 \cdot (i+2R)/R \rfloor) \bmod C \quad (5)$$

$$W_{2,i}(j) = (j + \lfloor 5 \cdot (i+3R)/R \rfloor) \bmod C \quad (6)$$

Where $A_i(j)$, $B_i(j)$, $Y_{1,i}(j)$, $W_{1,i}(j)$, $Y_{2,i}(j)$, and $W_{2,i}(j)$, indicate the intra-row permutation formula for j-th element of i-th row of sub-block A, B, $Y_1$, $W_1$, $Y_2$ and $W_2$, respectively. It's noted that different blocks may have different permutation formulas to avoid the parity bits of each systematic bit being allocated into same constellation layer as the corresponding systematic bit. As another example, the following equation can be used;

$$A_i(j) = (j + \lfloor 5 \cdot C \cdot i/N \rfloor) \bmod C \quad (7)$$

$$B_i(j) = (j + \lfloor 5 \cdot C \cdot (i+R)/N \rfloor) \bmod C \quad (8)$$

$$Y_{1,i}(j) = (j + \lfloor 5 \cdot C \cdot i/N \rfloor) \bmod C \quad (9)$$

$$W_{1,i}(j) = (j + \lfloor 5 \cdot C \cdot (i+R)/N \rfloor) \bmod C \quad (10)$$

$$Y_{2,i}(j) = (j + \lfloor 5 \cdot C \cdot (i+2R)/N \rfloor) \bmod C \quad (11)$$

$$W_{2,i}(j) = (j + \lfloor 5 \cdot C \cdot (i+3R)/N \rfloor) \bmod C \quad (12)$$

where N is the block size of each sub-block.

Figure 7:
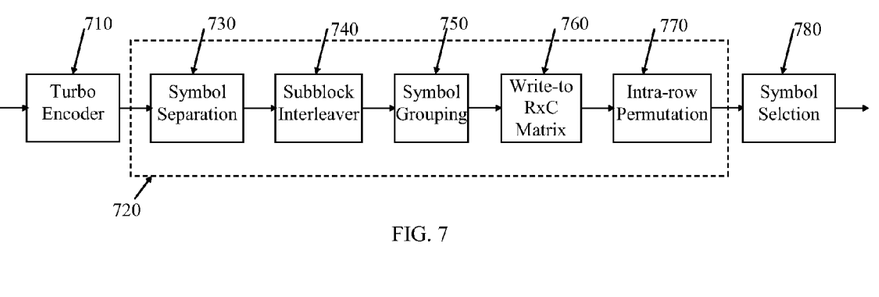
FIG. 7 illustrates another embodiment of channel coding process of the present invention.

FIG. 7 illustrates another embodiment of a channel coding process of the present invention. First, the input packet is encoded by turbo encoder 710. Then, the turbo encoded codeword goes through the interleaving block 720 and the puncturing is performed in symbol selection block 780. Another embodiment of interleaving block of the present invention 720 comprises symbol separation block 730, sub-block interleaver 740, symbol grouping block 750, write to R×C matrix block 760 and intra-row permutation block 770.

The operation of each block in the interleaving block 720 such as, symbol separation block 730, sub-block interleaver 740, symbol grouping block 750, write-to R×C matrix block 760 and intra-row permutation block 770 is same as the operation of those blocks described with respect to FIG. 5. The only difference is in write-to R×C matrix block 760 and intra-row permutation block 770 in terms of operation scope. In FIG. 7, those two blocks have two options. In a first option, they are operated after combining all sub-blocks into one block and in the other option they are operated sub-block by sub-block like in FIG. 5.

Figure 8:
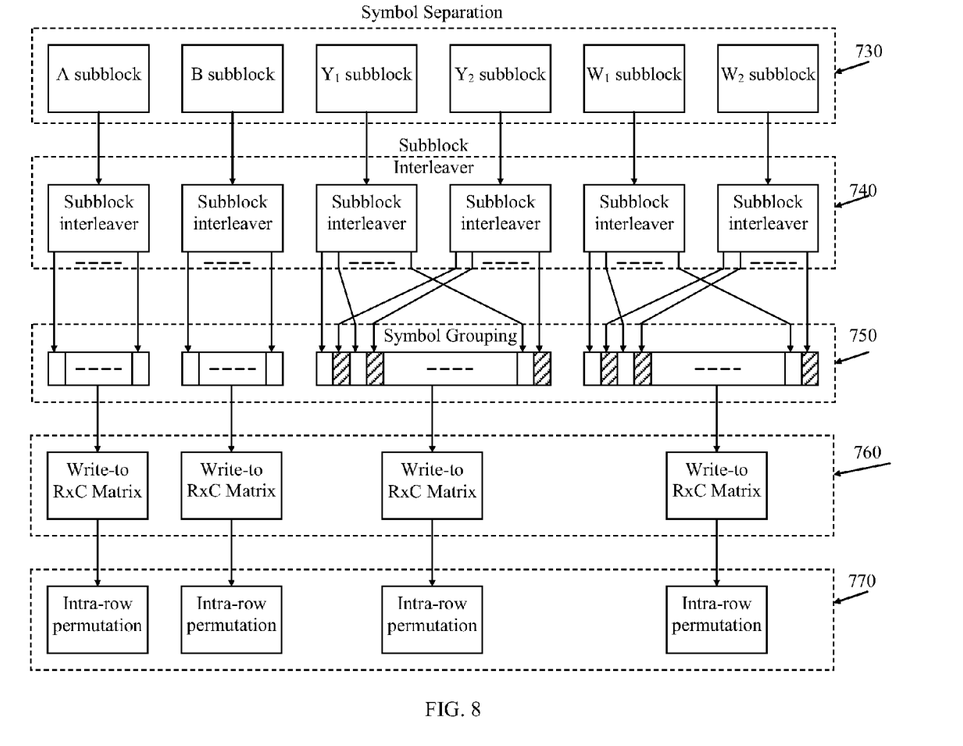
FIG. 8 illustrates the detail of channel interleaving scheme of another embodiment of the present invention.

FIG. 8 shows the detailed operation of the interleaving block presented in FIG. 7.

In FIG. 8, symbol separation block 730, sub-block interleaver 740, and symbol grouping block 750 are identical to the respective blocks described in FIG. 6. In addition, write-to R×C matrix block 760 and intra-row permutation block 770 are operated in the same way as write-to R×C matrix block 550 and intra-row permutation block 560. The embodiment as shown in FIG. 8 may have multiple write-to R×C matrix blocks 760 and intra-row permutation blocks 770 for each sub-block or grouped sub-block comprising several sub-blocks.

The same permutation formula as shown in equations 1-12 can be used in Intra-row permutation block 770 when write-to R×C matrix block 760 and intra-row permutation block 770 are operated separately on different sub-block. The only difference would be the block size because after symbol grouping 750 the parity blocks $Y_{1,i}(j)$ and $Y_{2,i}(j)$ and the blocks $W_{1,i}(j)$ and $W_{2,i}(j)$ are formed into one block. When write-to R×C matrix block 760 and intra-row permutation block 770 are applied after concatenating all the sub-blocks, which means there is only one write-to R×C matrix block and intra-row permutation block, one of the equations 1-12 can be used.

Figure 9:
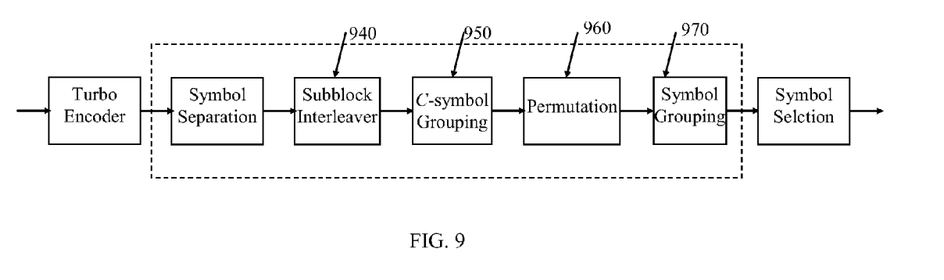
FIG. 9 illustrates another embodiment channel coding process of the present invention having equivalent operation with embodiment in FIG. 5.

Write-to R×C matrix block and intra-row permutation block presented as embodiment of the invention in from FIG. 5 to FIG. 8 can be replaced by the blocks having the equivalent functions. One example can be C-symbol grouping block 950 and permutation block 960 as shown in FIG. 9. The embodiment shown in FIG. 9 can have an equivalent operation with one presented in FIG. 5. C-symbol grouping block 950 sequentially collects C symbols from the output of sub-block interleaver 940 and the collected C symbols are formed into one group comprising C elements. Then, in the permutation block 960, the C elements of each group are reordered according to the predetermined pattern. The permuted group comprising C elements is fed into symbol grouping block 970.

Figure 10:
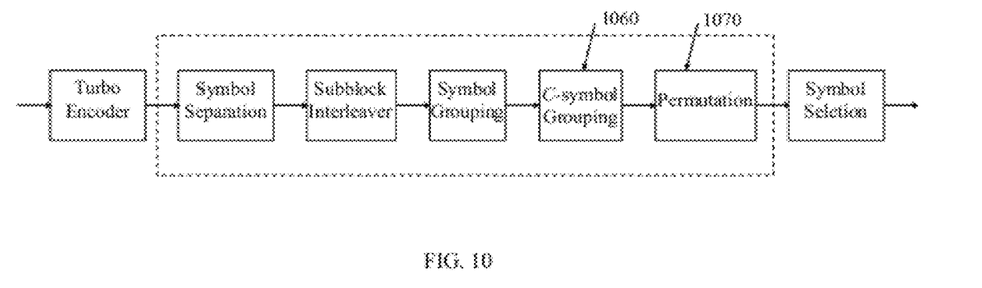
FIG. 10 illustrates another embodiment channel coding process of the present invention having equivalent operation with embodiment in FIG. 7.

FIG. 10 illustrates another embodiment which can replace the embodiment shown in FIG. 7. All other blocks than C-symbol grouping 1060 and permutation block 1070 are identical to blocks shown in FIG. 7. C-symbol grouping 1060 and permutation block 1070 perform the identical operation as C-symbol grouping 950 and permutation block 960 in FIG. 9.

Figure 11:
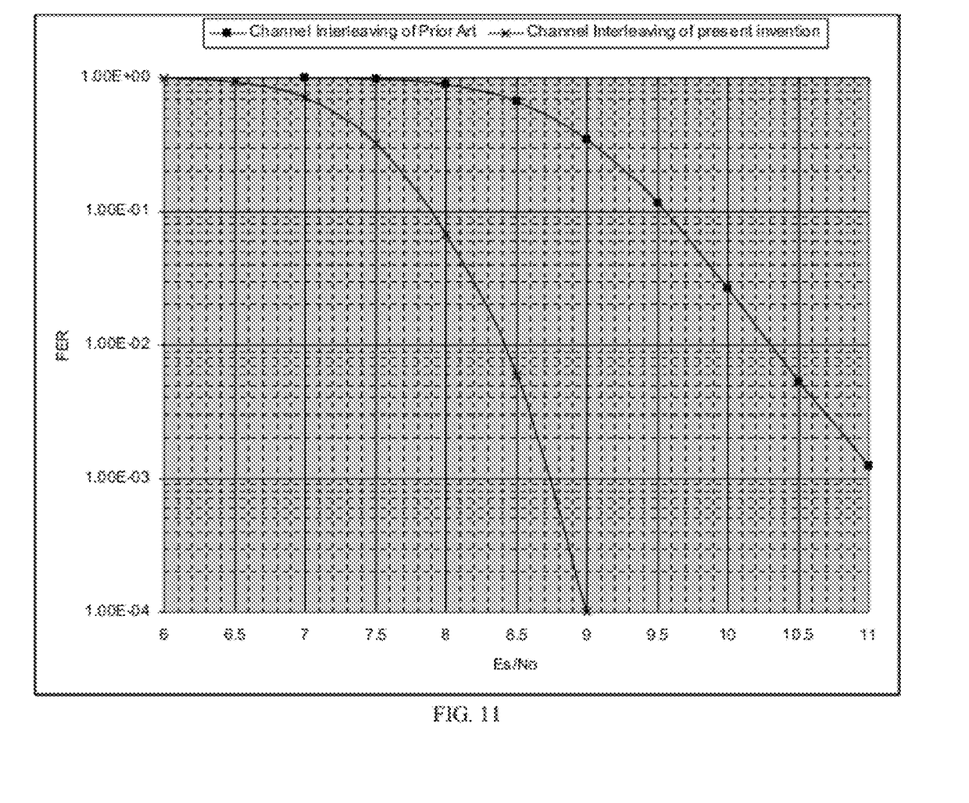
FIG. 11 shows the performance comparison of the present invention with the prior art.

FIG. 11 shows the performance of turbo code with channel interleaving in accordance with prior art and the present invention. Equations 1-6 are used as the permutation formula for the intra-row permutation of each sub-block and the input packet size and modulation are set to 384 and 64-QAM. It shows the present invention has about 1.9 dB gain over the prior art.

What is claimed is:

1. A communication method, the method comprising:
   receiving a sequence of information bits to be transmitted;
   encoding the information bits to generate a plurality of systematic bits and a plurality of parity bits;

grouping the systematic bits and the parity bits in a plurality of output blocks; and assigning each output block to one of a plurality of addresses of a constellation scheme, wherein the plurality of addresses includes a first set of addresses that are more prone to error and a second set of addresses that are less prone to error, and wherein groups of consecutive information bits in the sequence of information bits are distributed amongst at least the first set of addresses and the second set of addresses such that the groups of consecutive information bits are not concentrated in the second set of addresses.

2. The method of claim 1 further comprising transmitting the output blocks, wherein the output blocks are transmitted over a wireless metropolitan area network (wireless MAN) or ultra mobile broadband (UMB) network, and wherein the constellation scheme comprises a 64-bit QAM scheme.

3. The method of claim 1, wherein grouping the systematic bits and the parity bits comprises:
demultiplexing through symbol separation the plurality of systematic bits and the plurality of parity bits into sub-blocks of systematic bits and sub-blocks of parity bits;
generating permuted sub-blocks by permuting symbols of each of the sub-blocks of systematic bits and each of the sub-blocks of parity bits using at least one sub-block interleaver, wherein each of the at least one sub-block interleavers uses a bit reversal operation (BRO) function;
writing symbols of each permuted sub-block into an R×C array wherein a row size R of the array is equal to ⌊N/C⌋ at column size C and sub-block size N;
permuting elements of each row of each permuted sub-block using a predetermined permuting pattern; and
forming at least one output block from a plurality of permuted sub-blocks, wherein the output blocks comprise elements from each permuted sub-block.

4. The method of claim 1, wherein grouping the systematic bits and the parity bits comprises:
demultiplexing through symbol separation the plurality of systematic bits and the plurality of parity bits into a plurality of sub-blocks of systematic bits and a plurality of sub-blocks of parity bits;
generating a plurality of permuted sub-blocks by permuting symbols of each of the sub-blocks of systematic bits and each of the sub-blocks of parity bits using a sub-block interleaver, wherein the sub-block interleaver uses a bit reversal operation to generate an output address;
grouping symbols of the permuted sub-blocks into R groups, each group containing C elements, wherein R is equal to ⌊N/C⌋ for a sub-block size N;
permuting elements of at least one of the R groups of using a predetermined permuting pattern for each permuted sub-block; and
forming the output blocks from the permuted sub-blocks, wherein symbol groups comprise elements from each permuted sub-block.

5. The method of claim 1, wherein grouping the systematic bits and the parity bits comprises:
demultiplexing through symbol separation the plurality of systematic bits and the plurality of parity bits into sub-blocks of systematic bits and sub-blocks of parity bits;
generating permuted sub-blocks by permuting symbols of each sub-block of the systematic bits and each sub-block of parity bits using at least one sub-block interleaver, wherein each of the at least one sub-block interleaver uses a bit reversal operation (BRO) function;
forming output sub-blocks from the permuted sub-blocks, wherein output sub-blocks comprise elements from each permuted sub-block;
writing symbols of each output sub-block into an R×C array, wherein a row size R of the array is equal to ⌊N/C⌋ at a column size C and an output sub-block size N; and
permuting elements of each row of each of the permuted sub-blocks using a predetermined permuting pattern of each permuted sub-block.

6. The method of claim 1, wherein grouping the systematic bits and the parity bits comprises:
demultiplexing through symbol separation the plurality of systematic bits and the plurality of parity bits into sub-blocks of systematic bits and sub-blocks of parity bits;
generating permuted sub-blocks by permuting symbols of each of the sub-blocks of systematic bits and each of the sub-blocks of parity bits using a sub-block interleaver, wherein the sub-block interleaver uses a bit reversal operation (BRO) function;
forming output sub-blocks from the permuted sub-blocks, wherein the output sub-blocks comprise elements from each permuted sub-block;
grouping symbols of each of the output sub-blocks into R groups containing C elements, wherein R is equal to ⌊N/C⌋ at predetermined value C and sub-block size N; and
permuting elements of each group of at least one grouped block using a predetermined permutation pattern of each permuted sub-block.

7. The method of claim 1, wherein encoding the information bits comprises using a channel encoder.

8. The method of claim 1, wherein encoding the information bits comprises encoding with a turbo code.

9. A method for channel coding, the method comprising:
encoding a packet to generate a plurality of systematic bits and a plurality of parity bits;
demultiplexing through symbol separation the plurality of systematic bits and the plurality of parity bits into at least one sub-block of systematic bits and at least one sub-block of parity bits;
generating at least one permuted sub-block by permuting symbols of the at least one sub-block of systematic bits and the at least one sub-block of parity bits;
writing symbols of each permuted sub-block into an R×C array having R rows and C columns;
performing intra-row permutation on each of the R rows using a predetermined permuting pattern associated with the corresponding permuted sub-block, wherein the predetermined permuting pattern is non-uniform such that at least some rows of the R×C array are permuted according to a different pattern than other rows of the same R×C array; and
forming at least one output block from the at least one permuted sub-block.

10. The method of claim 9, wherein the intra-row permutation changes the sequence of symbols within each of the R rows of the R×C array.

11. The method of claim 9, wherein generating the at least one permuted sub-block comprises using at least one sub-block interleaver, wherein the at least one sub-block interleaver uses a bit reverse operation (BRO) function to generate an output address.

12. The method of claim 9, wherein generating the at least one permuted sub-block comprises using at least one sub-block interleaver.

13. The method of claim 9, wherein R is equal to $\lfloor N/C \rfloor$, wherein the at least one permuted sub-block includes at least N symbols.

14. The method of claim 9 further comprising:
selecting symbols from the at least one output block;
mapping the symbols to a constellation scheme; and
modulating the mapped symbols in accordance with the constellation scheme.

15. A method for channel coding, the method comprising:
encoding a packet using a channel encoder, wherein the channel encoder generates a plurality of systematic bits and a plurality of parity bits;
demultiplexing through symbol separation the plurality of systematic bits and the plurality of parity bits into at least one sub-block of systematic bits and at least one sub-block of parity bits;
generating a plurality of permuted sub-blocks by permuting symbols of the at least one sub-block of systematic bits and the at least one sub-block of parity bits;
forming output sub-blocks from the permuted sub-blocks, wherein each output sub-block comprises elements from each permuted sub-block;
writing the output block into an R×C array having R rows and C columns; and
performing intra-row permutation on each of the R rows using a predetermined permuting pattern associated with the corresponding permuted sub-block, wherein the intra-row permutation changes the sequence of symbols within each of the R rows of the R×C array, and wherein the predetermined permuting pattern is non-uniform such that at least some rows of the R×C array are permuted according to a different pattern than other rows of the same R×C array.

16. The method of claim 15, wherein R is equal to $\lfloor N/c \rfloor$, and wherein each permuted sub-block includes at least N symbols.

17. The method of claim 15, wherein generating permuted sub-blocks comprises using at least one sub-block interleaver, and wherein the at least one sub-block interleaver uses a bit reversal operation (BRO) function to generate an output address.

18. A method for performing a channel coding process using a channel interleaver that performs a bit reversal operation (BRO) function in a wireless communication system, the method comprising:
encoding a packet using a channel encoder, wherein the channel encoder generates a plurality of systematic bits and a plurality of parity bits;
demultiplexing through symbol separation the plurality of systematic bits and the plurality of parity bits into at least one sub-block of systematic bits and at least one sub-block of parity bits;
generating at least one permuted sub-block by permuting symbols of the at least one sub-block of systematic bits and the at least one sub-block of parity bits using at least one sub-block interleaver, wherein the at least one sub-block interleaver uses a BRO function to generate an output address;
writing symbols of the at least one permuted sub-block into an R×C array, wherein a row size R of the array is equal to $\lfloor N/C \rfloor$ at a predetermined column size C and a sub-block size N;
performing intra-row permutation on the R×C array to alter the sequencing of elements within each row of the R×C array using a predetermined permuting pattern of the at least one permuted sub-block, wherein the intra-row permutation changes the sequence of symbols within each of the R rows of the R×C array, and wherein the predetermined permuting pattern is non-uniform such that at least some rows of the R×C array are permuted according to a different pattern than other rows of the same R×C array; and
forming at least one output block from a plurality of permuted sub-blocks, wherein the output blocks comprise elements from each permuted sub-block.

19. An apparatus for channel coding using a bit reversal operation (BRO) function, the apparatus comprising:
a processor; and
a computer readable storage medium storing programming for execution by the processor, the programming including instructions to:
encode a packet using a channel encoder, wherein the channel encoder generates a plurality of systematic bits and a plurality of parity bits;
demultiplex through symbol separation the plurality of systematic bits and the plurality of parity bits into at least one sub-block of systematic bits and at least one sub-block of parity bits;
generate at least one permuted sub-block by permuting symbols of the at least one sub-block of systematic bits and the at least one sub-block of parity bits using at least one sub-block interleaver, wherein the at least one sub-block interleaver uses a BRO function to generate an output address;
write symbols of the at least one permuted sub-block into an R×C array having R rows and C columns;
perform intra-row permutation on each of the R rows using a predetermined permuting pattern, wherein the predetermined permuting pattern is associated with the corresponding permuted sub-block, wherein the intra-row permutation changes the sequence of symbols within each of the R rows of the R×C array, and wherein the predetermined permuting pattern is non-uniform such that at least some rows of the R×C array are permuted according to a different pattern than other rows of the same R×C array; and
form at least one output block from a plurality of permuted sub-blocks, wherein output blocks comprise elements from each permuted sub-block.

20. A method for performing a channel coding process using a channel interleaver that performs a bit reversal operation (BRO) function in a wireless communication system, the method comprising:
encoding a packet using a channel encoder, wherein the channel encoder generates a plurality of systematic bits and a plurality of parity bits;
demultiplexing through symbol separation the plurality of systematic bits and the plurality of parity bits into at least one sub-block of systematic bits and at least one sub-block of parity bits;
generating at least one permuted sub-block by permuting symbols of the at least one sub-block of systematic bits and the at least one sub-block of parity bits using at least one sub-block interleaver, wherein the at least one sub-block interleaver uses a BRO function to generate an output address;
forming at least one output sub-block from a plurality of permuted sub-blocks, wherein the at least one output sub-block comprises elements from each permuted sub-block;
writing symbols of the at least one output sub-block into an R×C array wherein a row size R of the array is equal to $\lfloor N/C \rfloor$ at a predetermined column size C and a grouped block size N; and performing intra-row permutation on each row of the R×C array using a predetermined permuting pattern to change the sequencing of elements in each row of the R×C array, wherein the predetermined permuting pattern of each permuted sub-block is unique to that sub-block, and wherein the predetermined permuting pattern is non-uniform such that at least some rows of the R×C array are permuted according to a different pattern than other rows of the same R×C array.

21. An apparatus for performing channel coding using a bit reversal operation (BRO) function, the apparatus comprising:
a processor; and
a computer readable storage medium storing programming for execution by the processor, the programming including instructions to:
encode a packet using a channel encoder, wherein the channel encoder generates a plurality of systematic bits and a plurality of parity bits;
demultiplex through symbol separation the plurality of systematic bits and the plurality of parity bits into at least one sub-block of systematic bits and at least one sub-block of parity bits;
generate at least one permuted sub-block by permuting symbols of the at least one sub-block of systematic bits and the at least one sub-block of parity bits using at least one sub-block interleaver, wherein the at least one sub-block interleaver uses a BRO function to generate an output address;
form at least one output sub-block from a plurality of permuted sub-blocks, wherein the output sub-block comprises elements from each permuted sub-block;
write symbols of each of the at least one output sub-block into an R×C array having R rows and C columns; and
perform intra-row permutation on each of the R rows of the R×C array using a predetermined permutation pattern, wherein the intra-row permutation changes the sequence of symbols within each of the R rows of the R×C array, and wherein the predetermined permuting pattern is non-uniform such that at least some rows of the R×C array are permutated according to a different pattern than other rows of the same R×C array.

22. An apparatus comprising:
an encoder;
a demultiplexer for separating symbols received from the encoder into systematic bits and parity bits;
a sub-block interleaver for generating permuted sub-blocks of symbols received from the demultiplexer; and
a permutation unit configured to separate symbols received from the sub-block interleaver into an R×C array having R rows and C columns, and perform intra-row permutation on each of the R rows according to a permuting pattern, wherein the permuting pattern is non-uniform such that at least some rows of the R×C array are permuted according to a different pattern than other rows of the R×C array.

23. The apparatus of claim 22, wherein the permutation unit comprises a memory having R rows and C columns.

24. The apparatus of claim 22 further comprising a symbol grouping block for grouping symbols received from the permutation unit into a plurality of output blocks.

25. The apparatus of claim 22 further comprising a symbol grouping block for grouping symbols received from the sub-block interleaver into a plurality of output sub-blocks, wherein the permutation unit separates symbols received from the sub-block interleaver via the symbol grouping block, wherein the permutation unit comprises a memory having R rows and C columns.

26. The apparatus of claim 22, wherein the encoder, the demultiplexer, the sub-block interleaver, and the permutation unit are all implemented by a digital signal processor.

\* \* \* \* \*